(12) United States Patent
Hara et al.

(10) Patent No.: US 11,187,948 B2
(45) Date of Patent: Nov. 30, 2021

(54) SUBSTRATE FOR DISPLAY DEVICE AND DISPLAY DEVICE

(71) Applicant: SHARP KABUSHIKI KAISHA, Sakai (JP)

(72) Inventors: Yoshihito Hara, Sakai (JP); Takashi Terauchi, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 139 days.

(21) Appl. No.: 16/712,137

(22) Filed: Dec. 12, 2019

(65) Prior Publication Data

US 2020/0201127 A1 Jun. 25, 2020

Related U.S. Application Data

(60) Provisional application No. 62/782,636, filed on Dec. 20, 2018.

(51) Int. Cl.
*G02F 1/1362* (2006.01)
*H01L 27/12* (2006.01)
*G02F 1/1343* (2006.01)
*G02F 1/1333* (2006.01)

(52) U.S. Cl.
CPC .... *G02F 1/136204* (2013.01); *G02F 1/13439* (2013.01); *G02F 1/133345* (2013.01); *G02F 1/136227* (2013.01); *G02F 1/136286* (2013.01); *H01L 27/1244* (2013.01)

(58) Field of Classification Search
CPC ........... G02F 1/136227; G02F 1/13439; G02F 1/136204; H01L 29/78696; G09G 2300/0413; G09G 3/3688
See application file for complete search history.

(56) References Cited

U.S. PATENT DOCUMENTS

| | | | |
|---|---|---|---|
| 2012/0223313 A1* | 9/2012 | Amano | H01L 29/78642 257/59 |
| 2012/0235137 A1* | 9/2012 | Koezuka | H01L 27/1052 257/43 |
| 2015/0277171 A1* | 10/2015 | Hwang | G02F 1/13318 349/46 |
| 2016/0071884 A1 | 3/2016 | Miyamoto et al. | |

(Continued)

FOREIGN PATENT DOCUMENTS

JP 2016-057344 A 4/2016

*Primary Examiner* — Michael H Caley
*Assistant Examiner* — Jonathan Y Jung
(74) *Attorney, Agent, or Firm* — ScienBiziP, P.C.

(57) ABSTRACT

A substrate for a display device includes pixels disposed in a display area where images are displayed, dummy pixels disposed in a non-display area that is outside the display area, lines that are sections of a metal film and extending from the display area to the non-display area, semiconductor sections included in the pixels and being sections of a semiconductor film that is disposed in a layer upper than the metal film via an insulator, the semiconductor sections being disposed to overlap the lines and not to overlap angled portions of the insulator that extend upward along edge portions of the lines, and dummy semiconductor sections included in the dummy pixels and being sections of the semiconductor film, the dummy semiconductor sections being disposed to overlap the lines and the angled portions.

7 Claims, 13 Drawing Sheets

(56) References Cited

U.S. PATENT DOCUMENTS

2016/0132713 A1* 5/2016 Bae ..................... G06K 9/0014
                                                      345/174
2017/0221443 A1* 8/2017 Koh ..................... G09G 3/3696
2018/0101076 A1   4/2018 Miyamoto et al.

* cited by examiner

SUBSTRATE FOR DISPLAY DEVICE AND DISPLAY DEVICE

CROSS REFERENCE TO RELATED APPLICATION

This application claims priority from U.S. Provisional Patent Application No. 62/782,636 filed on Dec. 20, 2018. The entire contents of the priority application are incorporated herein by reference.

TECHNICAL FIELD

The technology described herein relates to a substrate for a display device and a display device.

BACKGROUND ART

A display device displaying images that is described in Japanese Unexamined Patent Application Publication No. 2016-57344 as an example has been known. The display device includes pixels including gate liens and signal lines and dummy pixels. The dummy pixels include the gate lines and a dummy semiconductor layer that crosses the gate lines via an insulating layer. The dummy semiconductor layer is electrically isolated from the dummy semiconductor layer of the dummy electrode that is adjacent thereto in the Y direction. The dummy pixels further include dummy signal lines extending in the Y direction. The dummy signal lines are connected to the dummy semiconductor layer through contact holes. The contact holes are arranged while having the gate lines therebetween in a plan view.

In the display device, the dummy pixels have a configuration substantially similar to that of the pixels within the display area. With such a configuration, if the gate line is charged, electricity may not be discharged surely from the gate line toward the dummy semiconductor layer including the dummy pixels and electricity may be discharged from the gate line toward the semiconductor layer including the pixels.

SUMMARY

The technology described herein was made in view of the above circumstances. An object is to increase reliability of preventing electrostatic breakdown in pixels that is caused by charging of a line.

A substrate for a display device according to the technology described herein includes pixels disposed in a display area where images are displayed, dummy pixels disposed in a non-display area that is outside the display area, lines that are sections of a metal film and extending from the display area to the non-display area, semiconductor sections included in the pixels and being sections of a semiconductor film that is disposed in a layer upper than the metal film via an insulator, the semiconductor sections being disposed to overlap the lines and not to overlap angled portions of the insulator that extend upward along edge portions of the lines, and dummy semiconductor sections included in the dummy pixels and being sections of the semiconductor film, the dummy semiconductor sections being disposed to overlap the lines and the angled portions.

According to the technology described herein, reliability of preventing electrostatic breakdown in pixels caused by charging of a line can be increased.

DETAILED DESCRIPTION

First Embodiment

Figure 1:
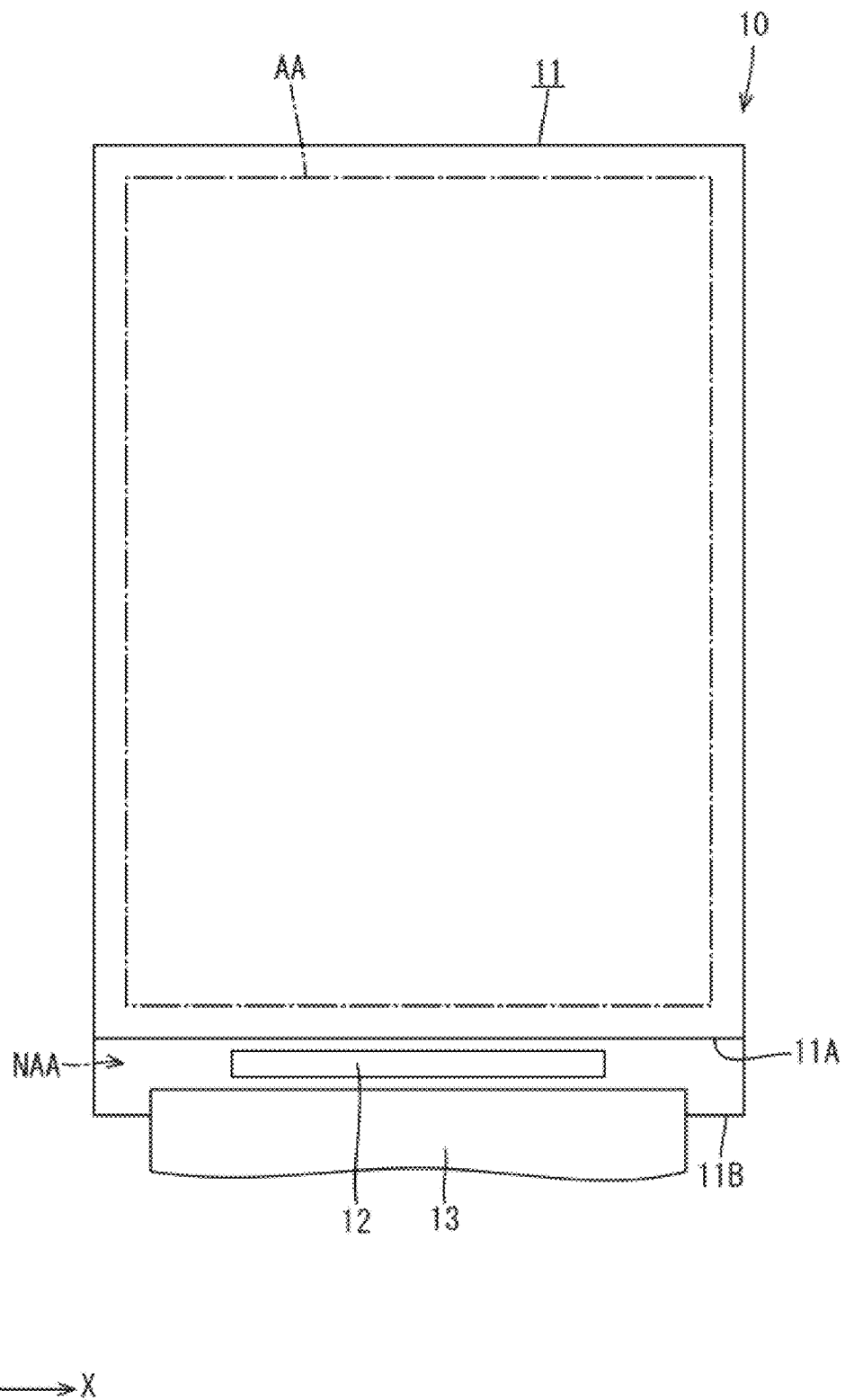
FIG. 1 is a plan view briefly illustrating a liquid crystal panel included in a liquid crystal display device according to a first embodiment.

A first embodiment will be described with reference to FIGS. 1 to 7. In this section, a liquid crystal display device 10 will be described. In the drawings, X-axes, Y-axes, and Z-axes may be present. The axes in each drawing correspond to the respective axes in other drawings. A vertical direction is defined with reference to FIGS. 4 to 7 and upper sides and lower sides of FIGS. 4 to 7 correspond to the front side and the rear side.

As illustrated in FIG. 1, the liquid crystal display device 10 includes a liquid crystal panel 11 (a display panel, a display device) displaying images and a backlight unit that is an external light source and is disposed on a rear side with respect to the liquid crystal panel 11. The backlight unit supplies light to the liquid crystal panel 11 for displaying. On the liquid crystal panel 11, a driver 12 (a signal supply section) for performing display driving and a flexible circuit board 13 (an external connecting component) are mounted via an anisotropic conductive film (ACF). The flexible circuit board 13 is connected to a control circuit board that supplies various kinds of input signals to the driver 12 from external devices.

As illustrated in FIG. 1, the liquid crystal panel 11 includes a plate surface (a display surface) that includes a display area AA (an active area) in a middle thereof and a non-display area NAA (a non-active area) surrounding the display area. Images can be displayed in the display area AA and the non-display area has a frame plan view shape. In FIG. 1, an outline of the display area is illustrated with a chain line and an area outside the chain line is the non-display area NAA. Pixels 11PX (refer FIG. 2), each of which is a display unit, are arranged along the X-axis direction and the Y-axis direction in a matrix (in rows and columns) in the display area AA of the liquid crystal panel 11. In the non-display area NAA of the liquid crystal panel 11, dummy pixels 11DPX (refer FIG. 2) that are not involved in displaying are arranged near a border between the non-display area NAA and the display area AA. The liquid crystal panel 11 at least includes a pair of glass substrates 11A, 11B. One on the front side (a front surface side) is a CF substrate 11A (a counter substrate) and another on the rear side (a rear surface side) is an array substrate 11B (an active matrix substrate, a substrate for a display device). A liquid crystal layer is disposed between the substrates 11A, 11B. Polarizing plates are bonded to outer surfaces of the substrates 11A and 11B, respectively.

Figure 2:
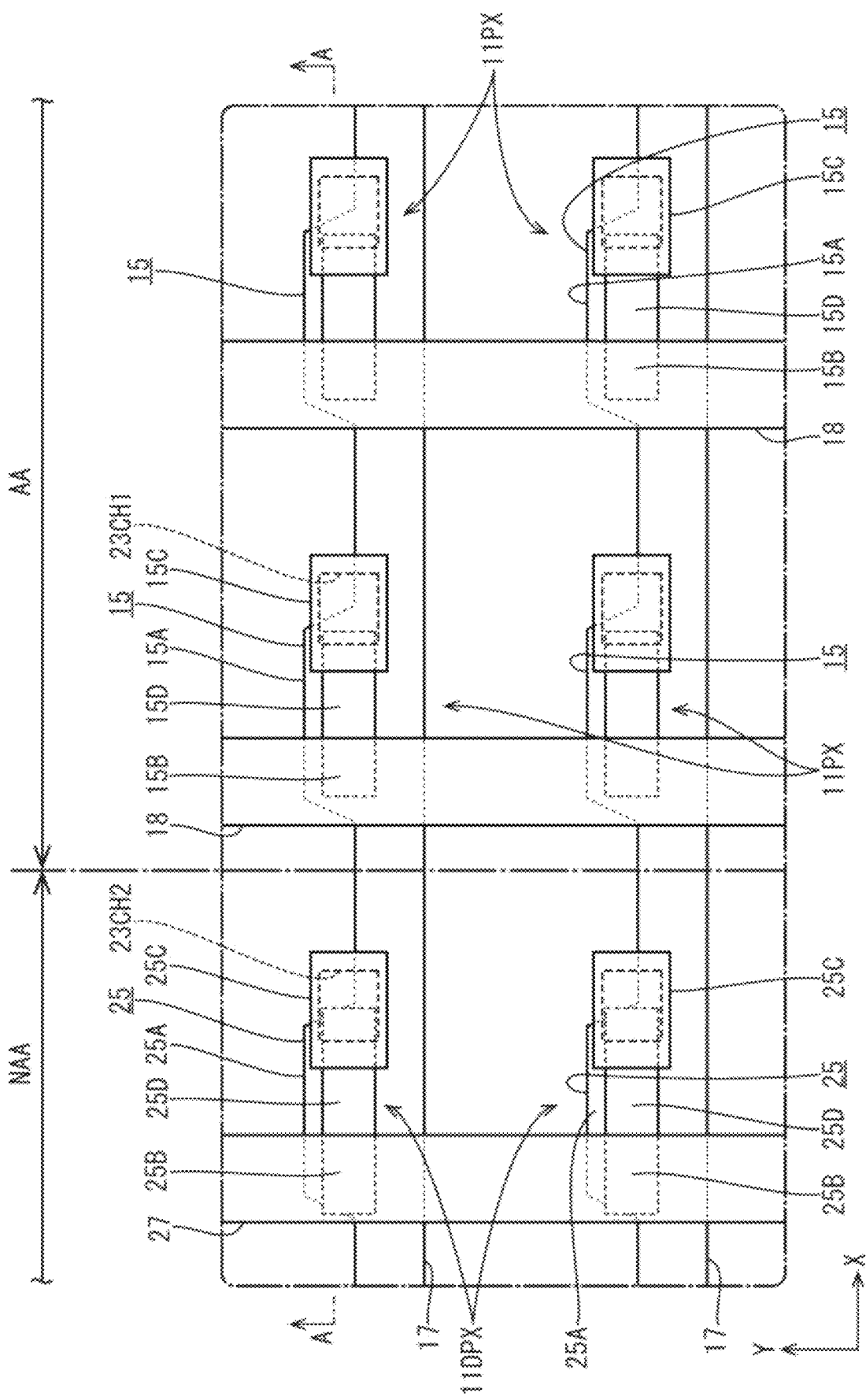
FIG. 2 is a plan view briefly illustrating arrangement of pixels in a section near a border between a display area and a non-display area of an array substrate included in the liquid crystal panel.
Figure 4:
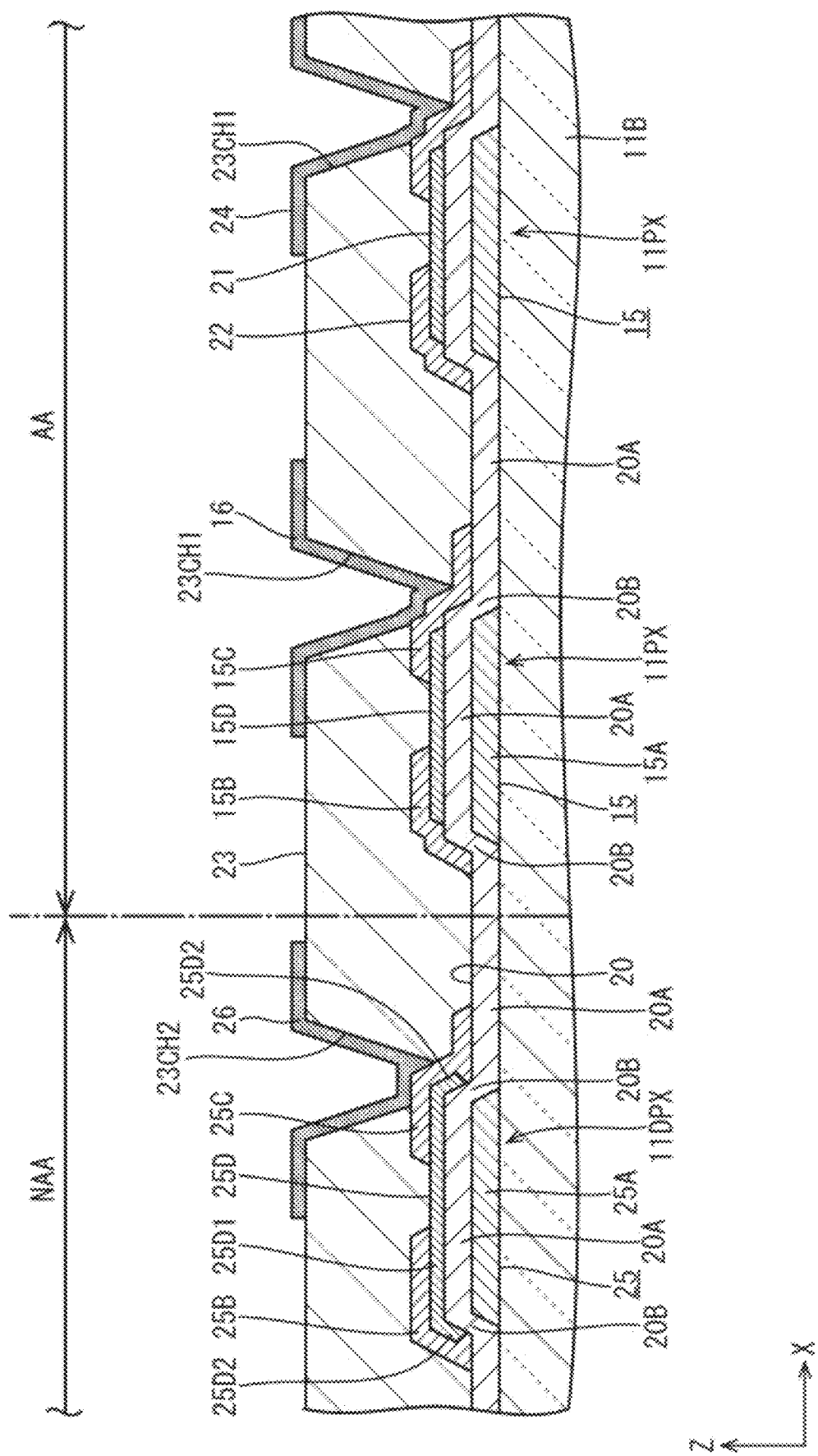
FIG. 4 is a cross-sectional view of the array substrate along line A-A in FIG. 2.

The pixels 11PX arranged in the display area AA will be described in detail. As illustrated in FIGS. 2 and 4, each pixel 11PX includes a TFT 15 (a switching component, a pixel switching component) and a pixel electrode 16. The TFTs 15 and the pixel electrodes 16 are arranged at intervals in a matrix in the display area AA. As illustrated in FIG. 2, gate lines 17 (lines, scanning lines) and source lines 18 (second lines, signal lines, data lines) are routed to surround the TFTs 15 and the pixel electrodes 16. The gate lines 17 extend substantially along the X-axis direction (a first direction) and extend from the display area AA to the non-display area NAA. The gate lines 17 are disposed such that middle sections thereof with respect to the extending direction thereof (the X-axis direction) are disposed in the display area AA and two end sections thereof are disposed in the non-display area NAA. A scanning signal (a signal) that is input from one of the two end sections of the gate line 17 is transmitted through the gate line 17. The source lines 18 extend substantially along the Y-axis direction (a second direction) that is perpendicular to the X-axis direction and extend from the display area AA to the non-display area NAA. The source lines 18 are disposed such that middle sections thereof with respect to the extending direction thereof (the Y-axis direction) are disposed in the display area AA and two end sections thereof are disposed in the non-display area NAA. One ends of the source lines 18 are electrically connected to the driver 12 in the non-display area NAA and an image signal (a signal, a data signal) that is output from the driver can be transmitted through the source line 18. The gate lines 17 are connected to gate electrodes 15A of the TFTs 15. The source lines 18 are connected to source electrodes 15B of the TFTs 15. The pixel electrodes 16 are connected to drain electrodes 15C (electrodes) of the TFTs 15. The pixel electrodes 16 are disposed in areas surrounded by the gate lines 17 and the source lines 18. A detailed configuration of the TFT 15 will be described later. On the other hand, a large number of color filters are disposed at positions opposed to the pixel electrodes 16 in the array substrate 10B to form a matrix in the display area AA of the CF substrate 10A. The color filters include red (R), green (G), and blue (B) filters that are arranged in predefined sequence repeatedly to form the pixels 11PX together with the pixel electrodes 16 opposed thereto. A light blocking film (a black matrix) is disposed between the adjacent color filters to reduce color mixture. A counter electrode is disposed in a solid manner on surfaces of the color filters and the light blocking film in the CF substrate 11A. The counter electrode is opposite the pixel electrodes 16 in the array substrate 11B. The counter electrode is always charged at a certain reference potential. Alignment films for anchoring liquid crystal molecules included in the liquid crystal layer are disposed on inner surfaces of the substrates 11A, 11B facing the liquid crystal layer, respectively.

Figure 3:
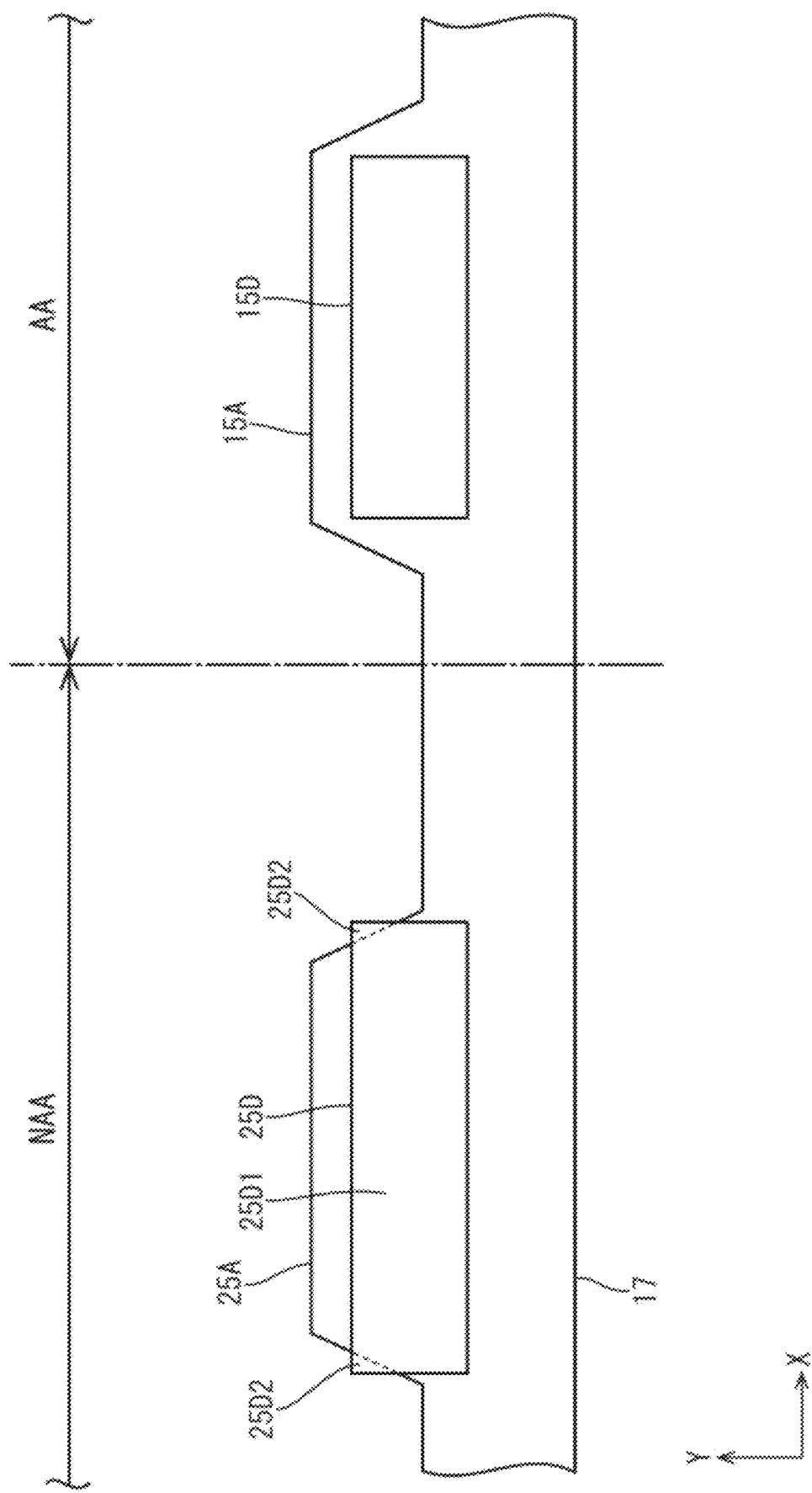
FIG. 3 is a magnified plan view illustrating a pattern of a first metal film and a semiconductor film included in the array substrate.

As illustrated in FIG. 4, the TFTs 15 are arranged next to and on a lower side of the respective corresponding target pixel electrodes 16, which are to be connected to, with reference to the Z-axis direction. The gate electrodes 15A of the TFTs 15 are sections of the gate lines 17 (overlapping sections overlapping semiconductor sections 15D). The gate lines 17 have wide sections that are configured as the gate electrodes 15A and project upward in FIG. 2 along the Y-axis direction. Each of the gate electrodes 15A has a projecting portion that projects from a body of the gate line 17. The projecting portion has a trapezoidal plan view shape and two edges with respect to the X-axis direction are inclined with respect to the X-axis direction and the Y-axis direction. The source electrodes 15B included in the TFTs 15 are sections of the source lines 18 (overlapping sections overlapping the semiconductor sections 15D). The source lines 18 have a constant width in both sections including the source electrodes 15B and sections without including the source electrodes 15B. The drain electrodes 15C included in the TFTs 15 are disposed away from the respective source electrodes 15B in the X-axis direction and one ends of the drain electrodes 15C are connected to the respective pixel electrodes 16. The TFTs 15 include the semiconductor sections 15D each of which is connected to the source electrode 15B and the drain electrode 15C. The semiconductor section 15D has a laterally long (elongated) shape extending in parallel to the gate line 17 along the X-axis direction. One end of the semiconductor section 15D is connected to the source electrode 15B and another end thereof is connected to another end of the drain electrode 15C (opposite end from a pixel electrode 16 side end). As illustrated in FIG. 3, the semiconductor section 15D is disposed such that an entire area thereof overlaps the gate electrode 15A (the gate line 17) in a plan view and is not located outside the gate electrode 15A. When a scanning signal transmitted through the gate line 17 is supplied to the gate electrode 15A, the semiconductor section 15D that overlaps the gate electrode 15A is switched from a non-conductive state to a conductive state. An image signal transmitted through the source line 18 is supplied from the source electrode 15B to the drain electrode 15C via the semiconductor section 15D. As a result, the pixel electrode is charged with a potential based on the image signal.

Various films disposed on top of each other on an inner surface of the array substrate 11B will be described with reference to FIG. 4. As illustrated in FIG. 4, the array substrate 10B includes a first metal film 19 (a metal film, a gate metal film), a gate insulator 20 (an insulator), a semiconductor film 21, a second metal film 22 (a source metal film), an inter-electrode insulator 23, a transparent electrode film 24, and an alignment film that are disposed on top of each other in this order from a lower layer side.

The first metal film 19 has a multilayer film made of multiple kinds of metals or a single-layer film made of one kind of metal and as illustrated in FIG. 4, the first metal film 19 includes sections that are configured as the gate lines 17 and the gate electrodes 15A of the TFTs 15. The gate insulator 20 is made of inorganic insulating material (inorganic material) such as silicon nitride ($SiN_x$) or silicon oxide ($SiO_2$). The semiconductor film 21 is a thin film made of oxide semiconductor or amorphous semiconductor, for example, and includes sections that are configured as the semiconductor sections 15D of the TFTs 15. The film thickness of the gate insulator 20 that is disposed between the first metal film 19 and the semiconductor film 21 defines a space between the gate electrode 15A and the semiconductor section 15D. Therefore, the thickness of the gate insulator 20 is preferably smaller to improve transistor characteristics of the TFTs 15. The second metal film 22 also has a multilayer film or a single-layer film similar to the first metal film 19. The second metal film 22 includes sections that are configured as the source lines 18, the source electrodes 15B and the drain electrodes 15C of the TFTs 15. The inter-electrode insulator 23 is made of organic insulating material (organic material) such as acrylic resin (PMMA) and has a film thickness greater than that of the gate insulator 20 made of inorganic resin material. The surface of the array substrate 11B becomes flat by the inter-electrode insulator 23. The transparent electrode film 24 is made of transparent electrode material such as ITO or IZO and includes sections that are configured as the pixel electrodes 16. The inter-electrode insulator 23 is disposed between the second metal film 22 and the transparent electrode film 24 to insulate the transparent electrode film 24 from the second metal film 22. The inter-electrode insulator 23 includes pixel contact holes 23CH1 in the display area AA. The pixel electrodes 16 that are sections of the transparent electrode film 24 are connected to the drain electrodes 15C that are sections of the second metal film 22 through the pixel contact holes 23CH1, respectively. Each of the pixel contact holes 23CH1 is formed in a position so as to overlap the pixel electrode 16 and the drain electrode 15C in a plan view.

Next, the dummy pixels 11DPX that are arranged in the non-display area NAA will be described in detail. As illustrated in FIGS. 2 and 4, the dummy pixels 11DPX include dummy TFTs 25 (dummy switching components) and dummy pixel electrodes 26. The dummy TFTs 25 and the dummy pixel electrodes 26 are arranged in an inner edge section of the non-display area NAA that is next to the display area AA. The dummy TFTs 25 and the dummy pixel electrodes 26 are arranged at intervals along the Y-axis direction. An interval between the dummy TFT 25 and the TFT 15 that is next to the dummy TFT 25 in the X-axis direction and is arranged at an outermost position in the display area AA is same as an interval between the adjacent TFTs 15 that are arranged in the display area AA in the X-axis direction. An interval between the dummy TFTs 25 that are arranged in the Y-axis direction and an interval between the dummy pixel electrodes 26 that are arranged in the Y-axis direction are same as an interval between the TFTs 15 that are arranged in the Y-axis direction in the display area AA and an interval between the pixel electrodes 16 that are arranged in the Y-axis direction in the display area AA, respectively. The number of the dummy TFTs 25 and the dummy pixel electrodes 26 arranged in the Y-axis direction is same as the number of the TFTs 15, the number of the pixel electrodes 16, and the number of the gate lines 17 arranged in the Y-axis direction. The dummy pixel electrode 26 has a same structure as that of the pixel electrode 16 and is a section of the transparent electrode film 24. A dummy line 27 is disposed in the non-display area NAA so as to extend in parallel to the source line 18 and substantially straight along the Y-axis direction. An entire area of the dummy line 27 is in the non-display area NAA and the dummy line 27 crosses all of the dummy TFTs 25 that are arranged along the Y-axis direction. The dummy line 27 is a section of the second metal film 22 that includes sections of the source lines 18. Two ends of the dummy line 27 in the extending direction thereof are not electrically connected to the driver 12.

As illustrated in FIG. 2, the dummy TFT 25 has a substantially same configuration as that of the TFT 15 except for a part thereof. The dummy TFTs 25 include dummy gate electrodes 25A, dummy source electrodes 25B, dummy drain electrodes 25C (dummy electrodes), and dummy semiconductor sections 25D. The dummy gate electrodes 25A of the dummy TFTs 25 are sections of the gate lines 17 (overlapping sections overlapping the dummy semiconductor sections 25D). Namely, the first metal film 19 includes sections configured as the dummy gate electrodes 25A and sections configured as the gate lines 17. The gate lines 17 have wide sections that are configured as the dummy gate electrodes 25A and project upward in FIG. 2 along the Y-axis direction. Each of the dummy gate electrodes 25A has a projecting portion that projects from a body of the gate line 17. The projecting portion has a trapezoidal plan view shape and two edges thereof in the X-axis direction are inclined with respect to the X-axis direction and the Y-axis direction. The dummy source electrodes 25B included in the dummy TFTs 25 are sections of the dummy line 27 (overlapping sections overlapping the dummy semiconductor sections 25D). Namely, the second metal film 22 includes sections configured as the dummy source electrodes 25B and sections configured as the dummy line 27. The dummy line 27 has a constant width in both sections including the dummy source electrodes 25B and sections without including the dummy source electrodes 25B. The dummy drain electrodes 25C included in the dummy TFTs 25 are disposed away from the respective dummy source electrodes 25B in the X-axis direction and one ends of the dummy drain electrodes 25C are connected to the respective dummy pixel electrodes 26. The second metal film 22 includes sections configured as the dummy drain electrodes 25C and sections configured as the drain electrodes 15C. The dummy TFTs 25 include the dummy semiconductor sections 25D each of which is connected to the dummy source electrode 25B and the dummy drain electrode 25C. The semiconductor film 21 includes sections configured as the dummy semiconductor sections 25D and sections configured as the semiconductor sections 15D. The dummy semiconductor section 25D has a laterally long (elongated) shape extending in parallel to the gate line 17 and along the X-axis direction. One end of the dummy semiconductor section 25D is connected to the dummy source electrode 25B and another end thereof is connected to another end of the dummy drain electrode 25C (opposite end from a dummy pixel electrode 26 side end). As illustrated in FIG. 4, the inter-electrode insulator 23 includes dummy pixel contact holes 23CH2 in the non-display area NAA. The dummy pixel electrodes 26, which are sections of the transparent electrode film 24, are connected to the dummy drain electrodes 25C, which are sections of the second metal film 22, through the dummy pixel contact holes 23CH2, respectively. Each of the dummy pixel contact holes 23CH2 is formed in a position so as to overlap the dummy pixel electrode 26 and the dummy drain electrode 25C in a plan view.

As illustrated in FIG. 3, the dummy semiconductor section 25D is disposed in the non-display area NAA such that a most area thereof overlaps the dummy gate electrode 25A (the gate line 17) in a plan view and a portion thereof is located outside the dummy gate electrode 25A and not overlapped with the dummy gate electrode 25A. A cross-sectional shape of the gate insulator 20 will be described in detail with reference to FIG. 4. The gate insulator 20 includes flat portions 20A and angled portions 20B (inclined portions). The flat portions 20A are substantially flat and disposed on the glass substrate of the array substrate 11B and the gate lines 17 (including the gate electrodes 15A and the dummy gate electrodes 25A). The angled portions 20B extend upward along edge portions of the gate lines 17 and connect the flat portions 20A on the glass substrate and the flat portions 20A on the gate lines 17. The angled portions 20B have an inclined cross-sectional shape and tend to have a film thickness smaller than that of the flat portions 20A. The dummy semiconductor section 25D includes an overlapping portion that overlaps the dummy gate electrode 25A in a plan view as a dummy gate overlapping portion 25D1 that overlaps the flat portion 20A of the gate insulator 20. The dummy semiconductor section 25D includes projecting portions that are outside the dummy gate electrode 25A and the projecting portions overlap the angled portions 20B of the gate insulator 20. The projecting portions are angled portion overlapping portions 25D2 (a dummy gate non-overlapping portion). Accordingly, the dummy gate overlapping portion 25D1 of the dummy semiconductor section 25D is parallel to the flat portion 20A of the gate insulator 20 and substantially flat. The angled portion overlapping portion 25D2 is along the angled portion 20B of the gate insulator 20 and has an inclined cross sectional shape. A gap between the dummy gate overlapping portion 25D1 of the dummy semiconductor section 25D and the dummy gate electrode 25A is equal to the film thickness of the flat portion 20A of the gate insulator 20. A gap between the angled portion overlapping portion 25D2 of the dummy semiconductor section 25D and the dummy gate electrode 25A is equal to the film thickness of the angled portion 20B of the gate insulator 20. Therefore, the gap between the angled portion overlapping portion 25D2 of the dummy semiconductor section 25D and the dummy gate electrode 25A is smaller than the gap between the dummy gate overlapping portion 25D1 of the dummy semiconductor section 25D and the dummy gate electrode 25A.

On the other hand, as illustrated in FIGS. 3 and 4, the semiconductor section 15D arranged in the display area AA overlaps the gate electrode 15A (the gate line 17) over an entire area thereof in a plan view and does not have a portion that is located outside the gate electrode 15A. Namely, an entire area of the semiconductor section 15D overlaps the flat portion 20A of the gate insulator 20 and the semiconductor section 15D does not overlap the angled portion 20B. Therefore, the semiconductor section 15D is parallel to the flat portion 20A of the gate insulator 20 and is flat over an entire area thereof. A gap between the semiconductor section 15D and the gate electrode 15A is equal to a film thickness of the flat portion 20A of the gate insulator 20. Namely, the gap between the semiconductor section 15D and the gate electrode 15A is equal to the gap between the dummy gate overlapping portion 25D1 of the dummy semiconductor section 25D and the dummy gate electrode 25A and is greater than the gap between the angled portion overlapping portion 25D2 of the dummy semiconductor section 25D and the dummy gate electrode 25A.

Figure 5:
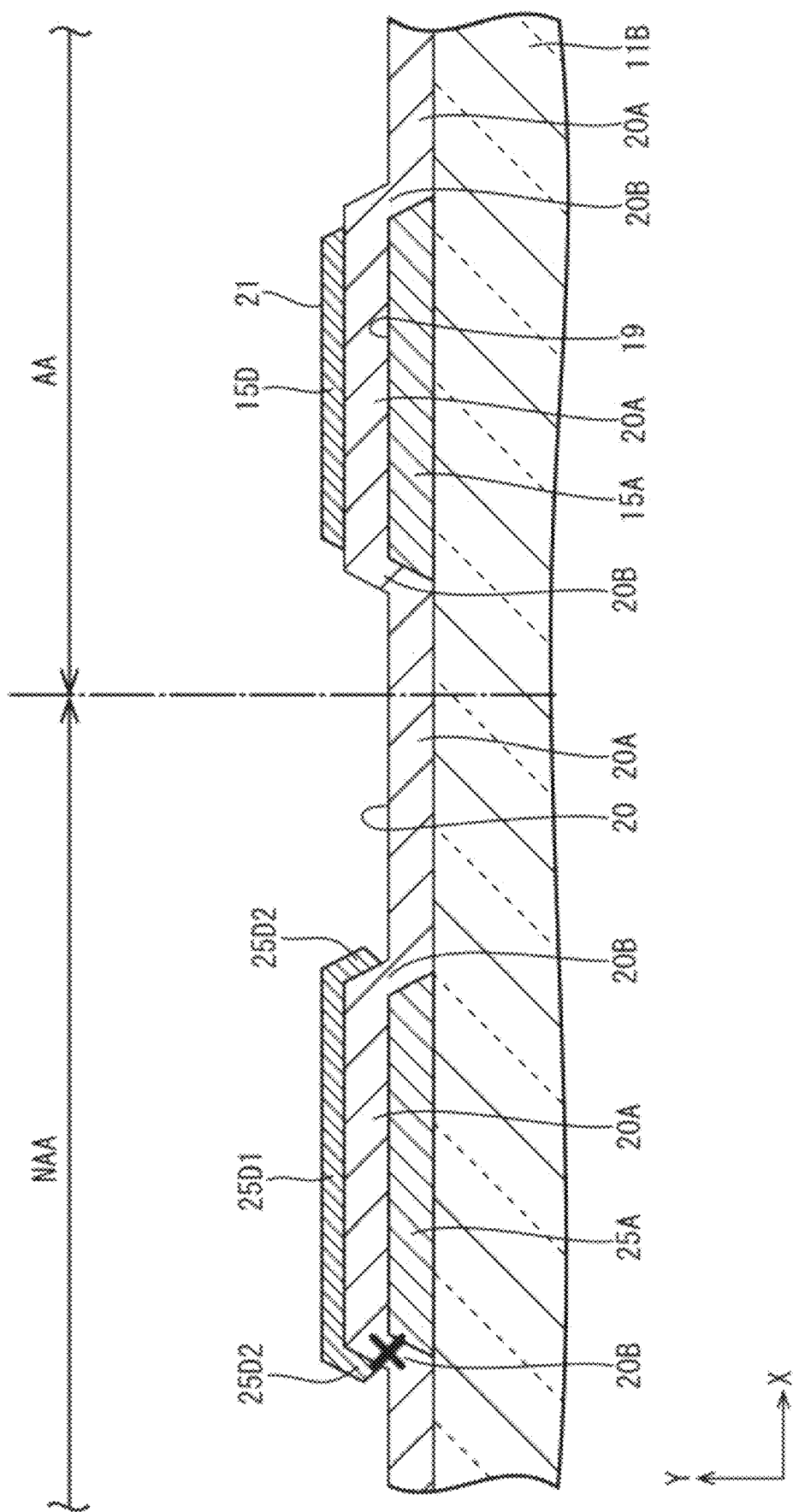
FIG. 5 is a cross-sectional view along line A-A in FIG. 2 illustrating the semiconductor film with patterning in producing the array substrate.

The present embodiment has the configuration described above. Next, a method of producing the array substrate 11B will be described. The array substrate 11B is produced with the photolithography method. The first metal film 19 is formed on the surface of the glass substrate and subsequently, a photoresist film made of photosensitive material is formed (refer FIG. 5). Then, after the photoresist film is exposed and developed through a photomask by an exposure device and portions of the photoresist film are removed, the first metal film 19 is etched through the portions where the photoresist film is removed. Accordingly, the first metal film 19 is patterned and the gate lines 17 (including the gate electrodes 15A and the dummy gate electrodes 25A) are formed. Thereafter, the photoresist film is removed with ashing or removal liquid. After the first metal film 19 is patterned as described above, the gate insulator 20 is formed. The gate insulator 20 includes the angled portions 20B at the portions thereof extending upward along the first metal film 19 while being inclined. Other portions are substantially flat and are configured as the flat portions 20A. After the gate insulator 20 is formed, the semiconductor film 21 is formed on the surface of the gate insulator 20 and the photoresist film is formed thereon. The semiconductor film 21 is etched via the photoresist film that is exposed and developed to be patterned similar to the first metal film 19 as described earlier. The semiconductor film 21 is etched to be patterned and the semiconductor sections 15D and the dummy semiconductor sections 25D are formed as illustrated in FIG. 5. The photoresist film formed on the semiconductor film 21 is removed with ashing or removal liquid after the etching of the semiconductor film 21.

Until the semiconductor sections 15D and the dummy semiconductor sections 25D are formed after the semiconductor film 21 is formed, the gate lines 17 that are sections of the first metal film 19 may be charged by electrostatic charge created when the glass substrate is transferred by the transfer device. Charges that are stored in the gate lines 17 according to the charge may be discharged over the gate insulator 20 toward the semiconductor film 21. As illustrated in FIG. 5, the dummy semiconductor section 25D is on the outer side with respect to the X-axis direction from the semiconductor section 15D that is at the outermost position in the display area AA with respect to the X-axis direction. Therefore, compared to the semiconductor section 15D, the charges stored in the gate line 17 are easily discharged to the dummy semiconductor section 25D. Further, the dummy semiconductor section 25D includes the angled portion overlapping portions 25D2 that are located outside the dummy gate electrode 25A and overlap the angled portions 20B of the gate insulator 20 and the gap between the dummy gate electrode 25A and each of the angled portion overlapping portions 25D2 is smaller than the gap between the gate electrode 15A and the semiconductor section 15D. Therefore, the charges stored in the gate line 17 are less likely to be transferred over the flat portion 20A of the great thickness but likely to be transferred over the angled portions 20B of the small thickness and to be discharged to the angled portion overlapping portions 25D2. Accordingly, electrostatic breakdown of the pixel 11PX caused by the charge of the gate lines 17 is likely to be prevented more surely. The portion where electrostatic discharge occurs is designated with "x" in FIG. 5.

Figure 6:
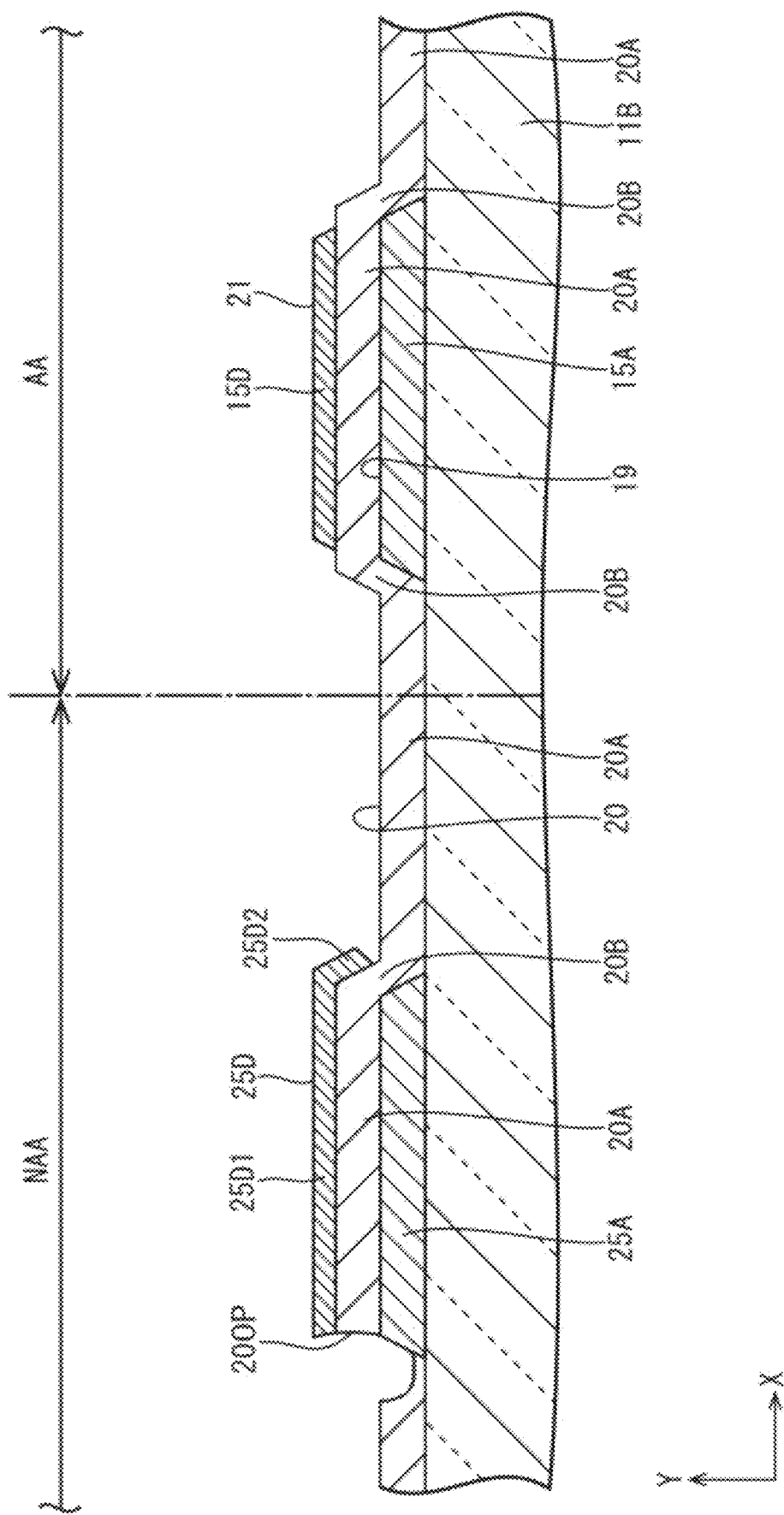
FIG. 6 is a cross-sectional view along line A-A in FIG. 2 illustrating that a hole is created in a gate insulator due to discharge in producing the array substrate.
Figure 7:
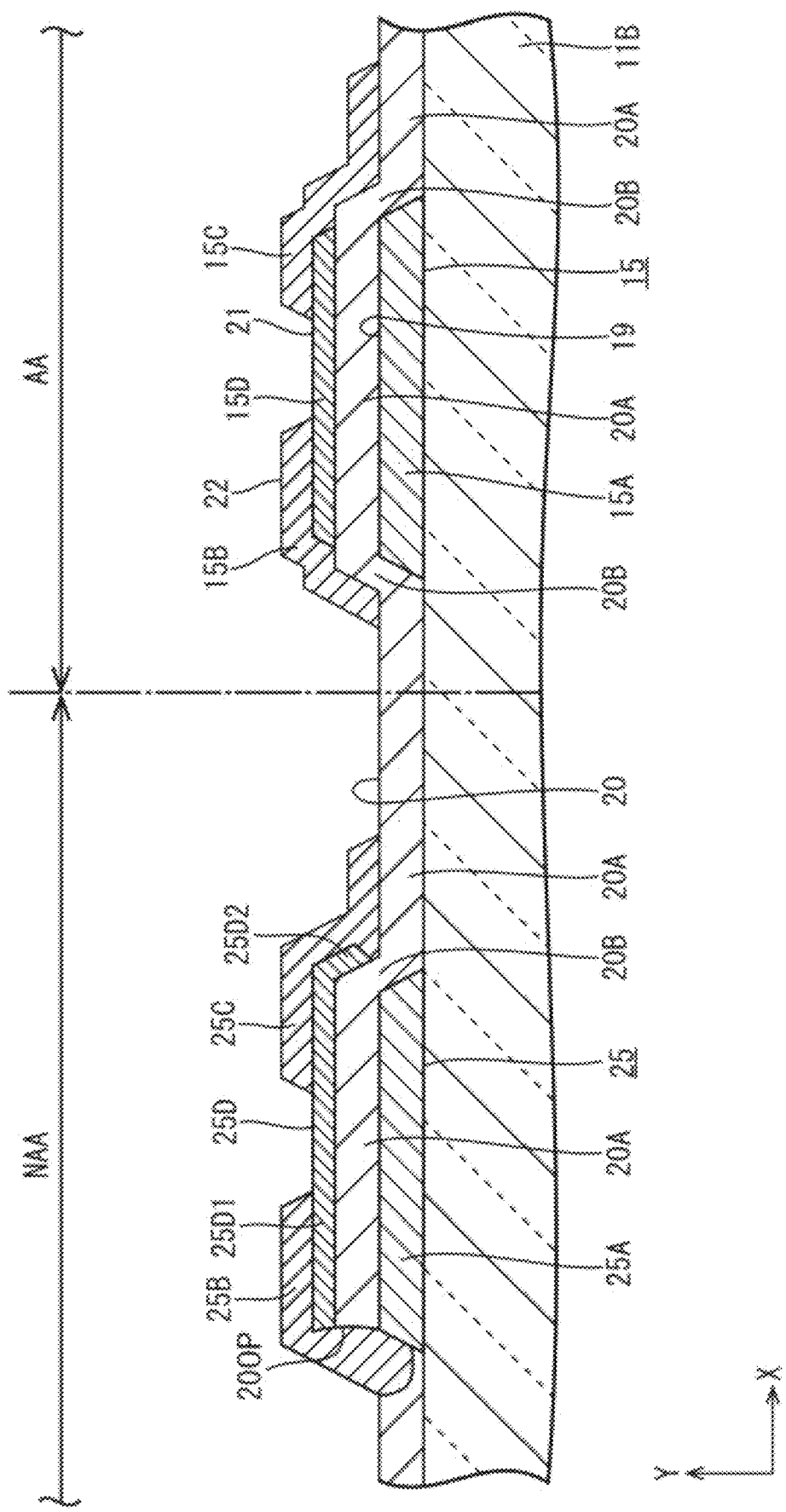
FIG. 7 is a cross-sectional view along line A-A in FIG. 2 illustrating a second metal film with patterning in producing the array substrate.

If electricity is discharged from the dummy gate electrode 25A to the angled portion overlapping portions 25D2 of the dummy semiconductor section 25D as described earlier, a hole 200P may be created in the angled portion 20B of the gate insulator 20 by electrostatic breakdown as illustrated in FIG. 6. Subsequently, the second metal film 22 is formed on the surface of the semiconductor film 21 and the photoresist film is formed thereon. The second metal film 22 is etched via the photoresist film that is exposed and developed to be patterned similarly to the first metal film 19 and the semiconductor film 21. The second metal film 22 is etched to be patterned and the source lines 18 (including the source electrodes 15B), the drain electrodes 15C, the dummy drain electrodes 25C, and the dummy line 27 (including the dummy source electrodes 25B) are formed as illustrated in FIG. 7. The dummy line 27 may be short-circuited to the dummy gate electrode 25A via the hole 200P formed in the angled portion 20B of the gate insulator 20. However, the dummy TFT 25 is not involved in displaying and thereofore, the short-circuit does not adversely affect displaying. The photoresist film formed on the second metal film 22 is removed with ashing or removal liquid after the etching of the second metal film 22.

Then, the inter-electrode insulator 23 is formed and patterned and thereafter, the transparent electrode film 24 is formed and patterned and the array substrate 11B having the configuration illustrated in FIG. 4 is obtained. In the process of patterning the transparent electrode film 24 and forming the pixel electrodes 16 and the dummy pixel electrodes 26, if electric discharge occurs between the source line 18 and the pixel electrode 16, the source line 18 and the pixel electrode 16 may be short-circuited although having the inter-electrode insulator 23 therebetween. As a result, electrostatic breakdown may be caused in the pixel 11PX. As illustrated in FIG. 4, the dummy line 27 is disposed on the outer side with respect to the X-axis direction from the source line 18 that is at the outermost position with respect to the X-axis direction in the display area AA. Therefore, compared to the source line 18 and the pixel electrode 16, the electric discharge is likely to occur between the dummy line 27 and the dummy pixel electrode 26. Accordingly, the pixels 11PX may not be damaged by electrostatic breakdown more surely. Further, since the dummy line 27 is not connected to the driver 12, the driver 12 is less likely to be damaged by electrostatic breakdown even if the electric discharge occurs in the dummy line 27.

As described earlier, the array substrate 11B (the substrate for a display device) in the present embodiment includes the pixels 11PX arranged in the display area AA where an image can be displayed, the dummy pixels 11DPX arranged in the non-display area NAA that is outside the display area AA, the gate lines 17 (lines), the semiconductor sections 15D, and the dummy semiconductor sections 25D. The gate lines 17 are disposed to extend from the display area AA to the non-display area NAA and are sections of the first metal film 19 (the metal film). The semiconductor sections 15D are included in the pixels 11PX and are sections of the semiconductor film 21 that is disposed in a layer upper than the first metal film 19 via the gate insulator 20 (the insulator). The semiconductor sections 15D are disposed to overlap the gate line 17 and not to overlap the angled portions 20B that extend upward along edge portions of the gate line 17. The dummy semiconductor sections 25D are included in the dummy pixels 11DPX and are sections of the semiconductor film 21. The dummy semiconductor sections 25D are disposed to overlap the gate line 17 and the angled portions 20B.

According to such a configuration, predetermined images can be displayed with the pixels 11PX in the display area AA. The pixels PX include the semiconductor sections 15D that are disposed to overlap the gate line 17 extending from the display area AA to the non-display area NAA. The semiconductor sections 15D are configured to be switched between the conductive state and the non-conductive state according to the signal supplied to the gate line 17. On the other hand, in the non-display area NAA, the dummy pixels 11DPX including the dummy semiconductor sections 25D are disposed and the dummy semiconductor sections 25D are disposed to overlap the gate lines 17. The dummy semiconductor sections 25D are sections of the semiconductor film 21 that includes sections configured as the semiconductor sections 15D. The gate insulator 20 is disposed in a layer upper than the first metal film 19, which includes sections configured as the gate lines 17, and the gate insulator 20 include sections that are configured as the angled portions 20B extending upward along the edge portions of the gate line 17. The film thickness of the angled portions 20B tends to be smaller than each thickness of the sections of the gate insulator 20 that overlap portions of the gate lines 17 other than the edge portions and the sections of the gate insulator 20 that do not overlap the gate lines 17. The semiconductor sections 15D included in the pixels 11PX are disposed not to overlap the angled portions 20B of the gate insulator 20. The dummy semiconductor sections 25D included in the dummy pixels 11DPX are disposed to overlap the angled portions 20B of the gate insulator 20. According to such a configuration, if the gate line 17 is charged, electricity is likely to be discharged from the gate line 17 toward the dummy semiconductor sections 25D via the angled portions 20B having the smaller thickness in the gate insulator 20. Therefore, compared to the configuration in which the dummy pixels 11DPX have a configuration same as that of the pixels PX, electricity is surely discharged from the gate lines 17 toward the dummy semiconductor sections 25D. Accordingly, electrostatic breakdown in the pixels 11PX that is caused by charging of the gate line 17 is surely prevented.

The array substrate 11B further includes the source lines 18 (the second lines) and the dummy line 27. Sections of the second metal film 22 (the second metal film) that is disposed in a layer upper than the semiconductor film 21 in the display area AA are configured as the source lines 18 (the second lines) and at least a portion of each source line 18 is connected to one end of the semiconductor section 15D. The source lines 18 cross the gate lines 17. According to such a configuration, if the semiconductor section 15D becomes in the conductive state according to the signal transmitted to the gate line 17, the signal supplied to the source line 18 is transferred to the semiconductor section 15D. If electric discharge occurs between the source line and other conductive member, electrostatic breakdown may be caused in the pixel 11PX. In this respect, since the dummy line 27 is configured by a section of the second metal film 22 that includes sections of the source lines 18, and the dummy line 27 is connected to one end of the dummy semiconductor section 25D in the non-display area NAA. Therefore, the electric discharge is likely to occur in the dummy line 27 than in the source lines 18. Accordingly, electrostatic breakdown in the pixel PX is more likely to be prevented. The source lines 18 and the dummy line 27 cross the gate lines 17 while having the gate insulator 20 therebetween so as to keep insulation therebetween.

The array substrate 11B further includes the drain electrodes 15C (the electrodes), the pixel electrodes 16, the dummy drain electrodes 25C (the dummy electrodes), and the dummy pixel electrodes 26. The drain electrodes 15C are included in the pixels 11PX and are sections of the second metal film 22. At least a portion of each drain electrode 15C is connected to another end of each semiconductor section 15D. The pixel electrodes 16 are included in the pixels 11PX and are sections of the transparent electrode film 24 that is disposed in a layer upper than the second metal film 22 via the inter-electrode insulator 23. The pixel electrodes 16 are connected to the drain electrodes 15C through the pixel contact holes 23CH1 formed in the inter-electrode insulator 23. The dummy drain electrodes 25C are included in the dummy pixel 11DPX and are sections of the second metal film 22. At least a portion of each dummy drain electrode 25C is connected to another end of each dummy semiconductor section 25D. The dummy pixel electrodes 26 are included in the dummy pixels 11DPX and are sections of the transparent electrode film 24. The dummy pixel electrodes 26 are connected to the dummy drain electrodes 25C through the dummy pixel contact holes 23CH2 formed in the inter-electrode insulator 23, respectively. According to such a configuration, if the semiconductor sections 15D become in the conductive state according to the signals transmitted to the gate lines 17, the signals transmitted to the source lines 18 are supplied to the drain electrodes 15C via the semiconductor sections 15D. Since the drain electrodes 15C are connected to the pixel electrodes 16 through the pixel contact holes 23CH1 in the inter-electrode insulator 23, respectively, the pixel electrodes 16 are charged with a potential according to the signal supplied to the source lines 18. If electric discharge occurs between the source line 18 and the pixel electrode 16, the source line 18 and the pixel electrode 16 are short-circuited even though having the inter-electrode insulator 23 therebetween, and as a result, electrostatic breakdown may be caused in the pixel 11PX. In this respect, in the non-display area NAA, the dummy drain electrodes 25C that are sections of the second metal film 22 including sections configured as the source lines 18 are connected to other ends of the dummy semiconductor sections 25D and the dummy pixel electrodes 26 that are sections of the transparent electrode film 24 including sections configured as the pixel electrodes 16 are connected to the dummy drain electrodes 25C through the dummy pixel control holes 23CH2 in the inter-electrode insulator 23, respectively. Therefore, electric discharge is more likely to occur between the dummy line 27 and the dummy pixel electrodes 26 than between the source line 18 and the pixel electrodes 16. Accordingly, electrostatic breakdown in the pixels 11PX is more likely to be prevented.

The array substrate 11B further includes the driver 12 (the signal supply section). The driver 12 is connected to the source lines 18 to be configured to supply signals to the source lines 18 but is not connected to the dummy line 27. According to such a configuration, the source lines 18 are supplied with signals supplied from the driver 12. The dummy line 27 is not connected to the driver 12 and therefore, even if electric discharge occurs in the dummy line 27, electrostatic breakdown is less likely to be caused in the driver 12 by the electric discharge.

The liquid crystal panel 11 (the display device) in the present embodiment includes the earlier-described array substrate 11B and the CF substrate 11A (the counter substrate) that is disposed opposite the array substrate 11B. According to such a liquid crystal panel 11, electrostatic breakdown is much less likely to be caused in the pixels 11PX by the charging of the gate line 17, and this improves reliability and display quality.

Second Embodiment

A second embodiment will be described with reference to FIGS. 8 to 13. The second embodiment includes an etching stopper film 28. Configurations, operations and effects similar to those of the first embodiment previously described will not be described.

Figure 8:
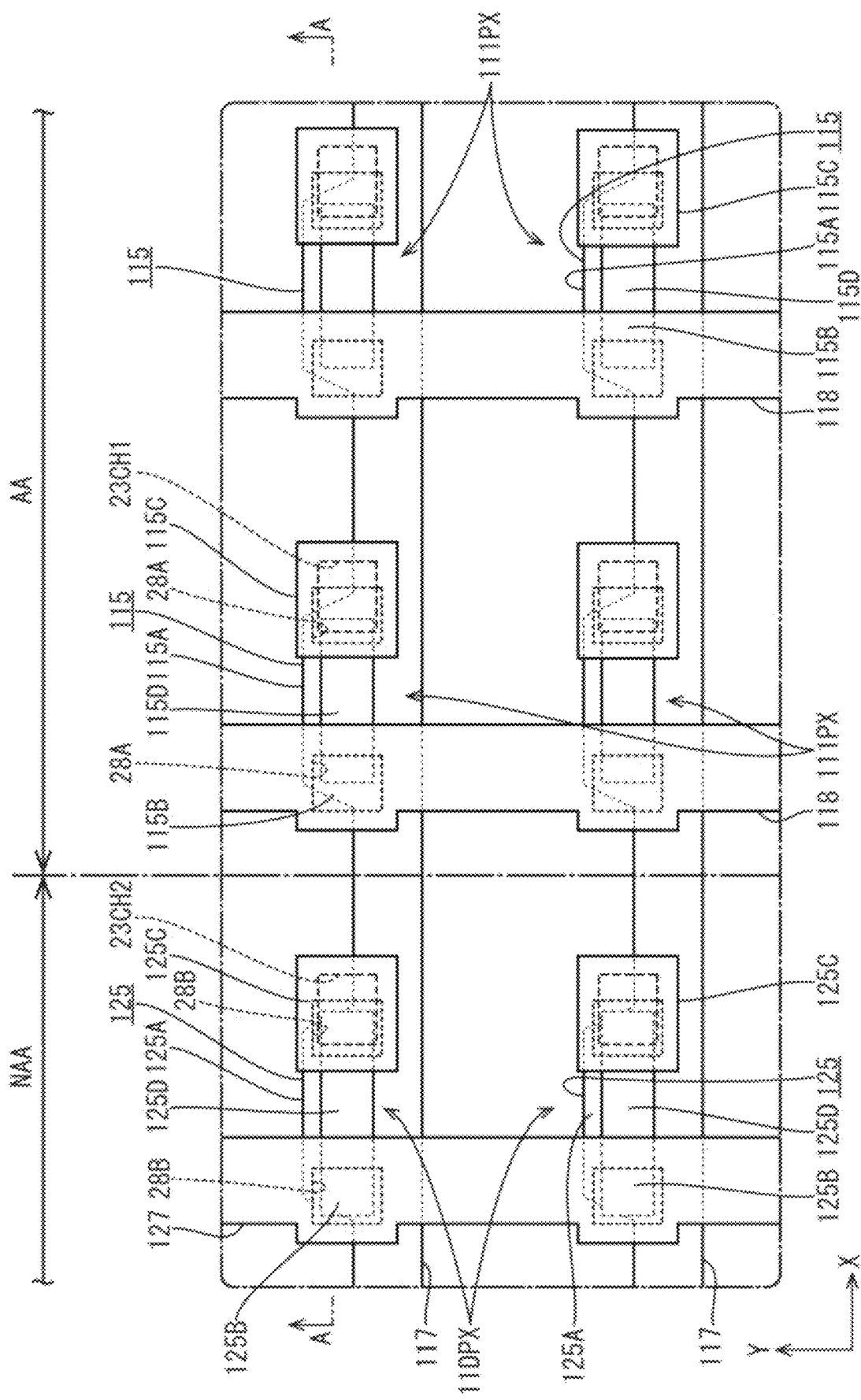
FIG. 8 is a plan view briefly illustrating arrangement of pixels in a section near a border between a display area and a non-display area of an array substrate according to a second embodiment.
Figure 10:
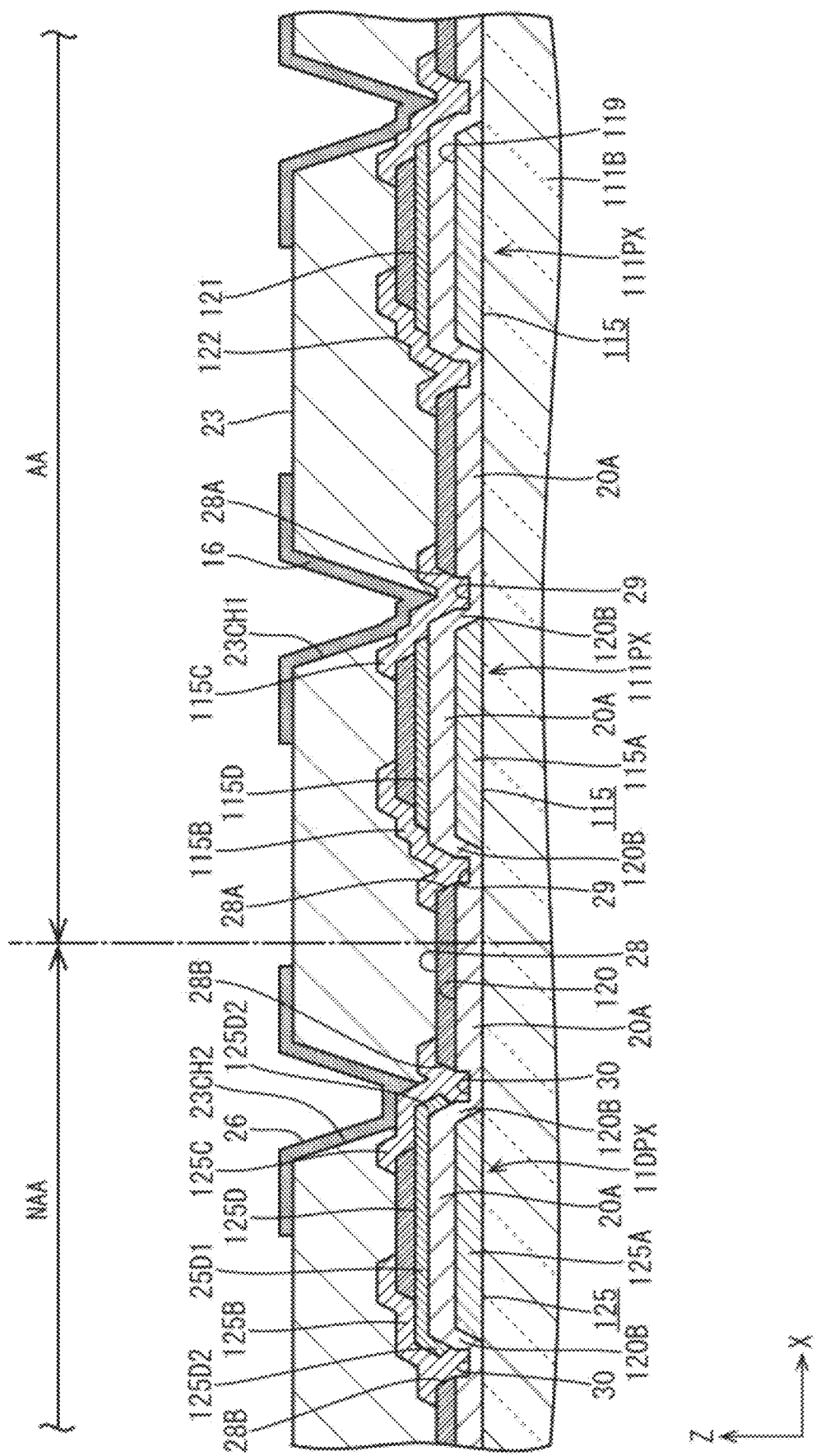
FIG. 10 is a cross-sectional view of the array substrate along line A-A in FIG. 8.

As illustrated in FIGS. 8 and 10, an array substrate 111B in this embodiment includes an etching stopper film 28 (a second insulator) between a semiconductor film 121 and a second metal film 122. The etching stopper film 28 is made of inorganic insulating material similar to a gate insulator 120 and keeps insulation between the semiconductor film 121 in a lower layer side and the second metal film 122 in a lower layer side. Since the etching stopper film 28 is disposed between the semiconductor film 121 and the second metal film 122, in forming source lines 118 with patterning the second metal film 122, semiconductor sections 115D disposed in a layer lower than the etching stopper film 28 are prevented from being over-etched. In the display area AA, the etching stopper film 28 includes pixel holes 28A for connecting source electrodes 115B (source lines 118), which are sections of the second metal film 122, and drain electrodes 115C to the semiconductor sections 115D, which are sections of the semiconductor film 121. The pixel holes 28A are formed such that each of the pixel holes 28A overlaps the source electrode 115B, the drain electrode 115C, and the semiconductor section 115D in a plan view.

Figure 9:
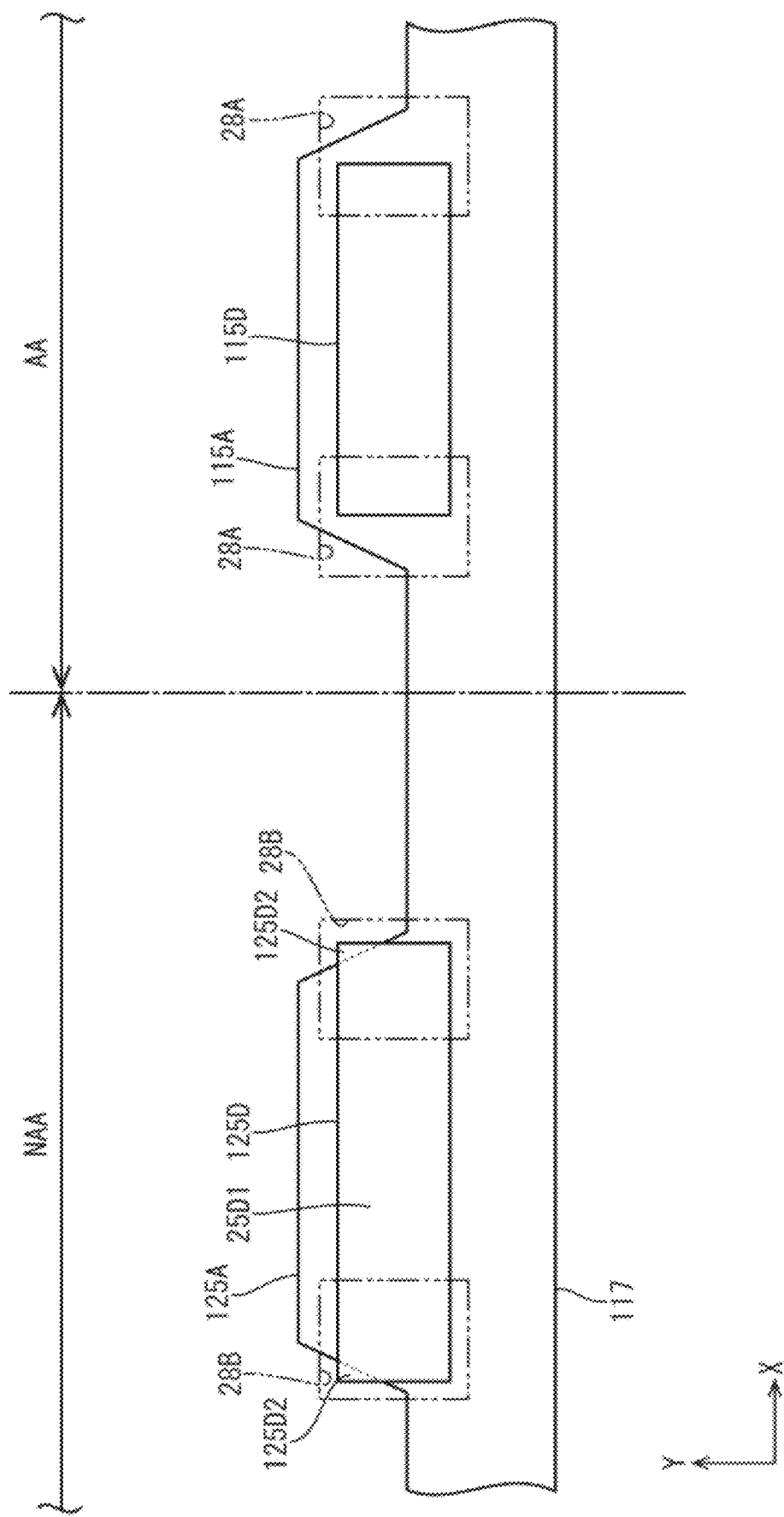
FIG. 9 is a magnified plan view illustrating a pattern of a first metal film and a semiconductor film included in the array substrate.

In detail, as illustrated in FIGS. 9 and 10, the pixel hole 28A is formed to have a hole area such that a portion of the pixel hole 28A overlaps an end of the semiconductor section 115D and other portion of the pixel hole 28A does not overlap the semiconductor section 115D in the display area AA. The other portion of the pixel hole 28A that does not overlap the semiconductor section 115D has a gate-like shape in a plan view so as to surround the end portion of the semiconductor section 115D from three directions and overlaps an angled portion 120B of the gate insulator 120. The pixel hole 28A has the above shape because the gate lines 117, the source lines 118, the drain electrodes 115C, and the semiconductor sections 115D become further refined due to enhancement of resolution. Namely, as the gate lines 117, the source lines 118, the drain electrodes 115C, and the semiconductor sections 115D are further refined, the hole area of the pixel hole 28A may become necessarily larger than a forming range of the semiconductor section 115D because of the resolution limitation of a producing device (for example, an exposure device) used for patterning the etching stopper film 28 in the producing process. The pixel holes 28A are formed by etching the etching stopper film 28. In the etching, over-etching may occur and the gate insulator 120 in the lower layer may be recessed. A pixel recess 29 is created in the gate insulator 120 by the over-etching of the etching stopper film 28. The pixel recess 29 is created in the angled portion 120B of the gate insulator 120 that extends upward along the edge portion of the gate electrode 115A due to the above-described arrangement of the pixel hole 28A. Therefore, electric discharge is likely to occur between the gate lines 117 and the semiconductor sections 115D compared to the first embodiment.

In the present embodiment, as illustrated in FIGS. 8 and 10, the etching stopper film 28 includes dummy pixel holes 28B in the non-display area NAA. The dummy pixel holes 28B are for connecting the dummy source electrodes 125B (a dummy line 127), which are sections of the etching stopper film 28, and the dummy drain electrodes 125C to the dummy semiconductor sections 125D, which are sections of the semiconductor film 121. The dummy pixel hole 28B is formed to overlap the dummy source electrode 125B, the dummy drain electrode 125C, and the dummy semiconductor section 125D in a plan view. In detail, as illustrated in FIGS. 9 and 10, the dummy pixel hole 28B is formed in the non-display area NAA such that a portion thereof overlaps an end portion of the dummy semiconductor section 125D and other portion thereof does not overlap the dummy semiconductor section 125D. The other portion of the dummy pixel hole 28B that does not overlap the dummy semiconductor section 125D has a gate-like shape in a plan view so as to surround the end portion of the dummy semiconductor section 125D from three directions and overlaps the angled portion 120B of the gate insulator 120. The dummy pixel holes 28B are formed together with the pixel holes 28A by etching the etching stopper film 28. In the etching, over-etching may occur and the gate insulator 120 in the lower layer may be recessed. A dummy pixel recess 30 that is communicated with the dummy pixel hole 28B may be created in the lower layer-side gate insulator 120 in addition to the pixel recess 29 that is communicated with the pixel hole 28A by the over-etching of the etching stopper film 28. The dummy pixel recess 30 in the gate insulator 120 is created in the angled portion 120B of the gate insulator 120 that extends upward along the edge portion of the dummy gate electrode 125A due to the above-described arrangement of the dummy pixel hole 28B. The dummy pixel recess 30 is formed in the angled portion 120B that extends upward along the edge portion of the dummy gate electrode 125A of the gate insulator 120 and an angled portion overlapping portion 125D2 of the dummy semiconductor section 125D is overlapped with the angled portion 120B. Therefore, even if the pixel recess 29 is created in the angled portion 120B that extends upward along the edge portion of the gate electrode 115A of the gate insulator 120, electric discharge is likely to occur between the gate lines 117 and the dummy semiconductor sections 125D compared to between the gate lines 117 and the semiconductor sections 115D. Accordingly, electrostatic breakdown in pixels 111PX is further less likely to be caused.

Figure 11:
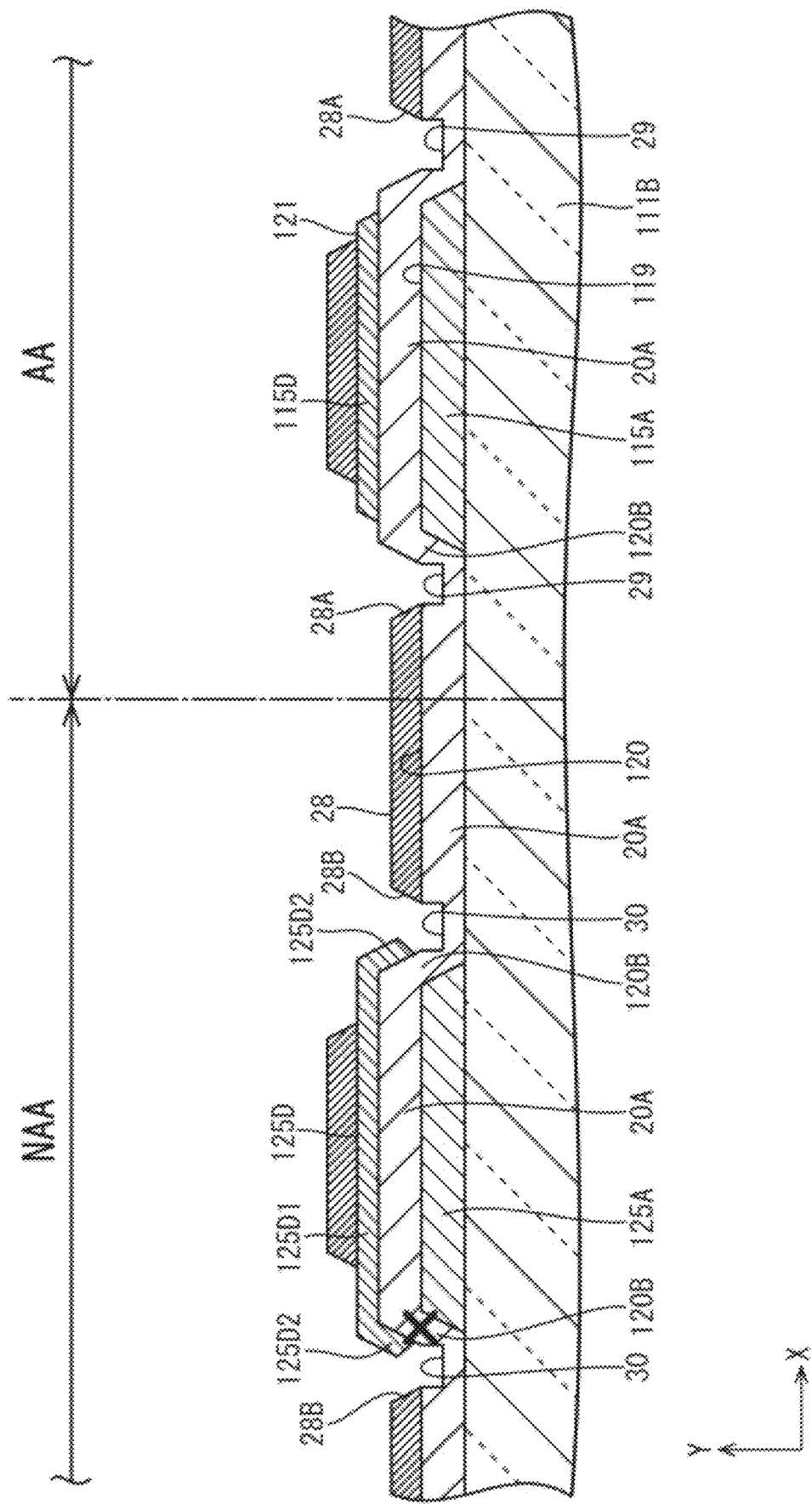
FIG. 11 is a cross-sectional view along line A-A in FIG. 8 illustrating the semiconductor film with patterning in producing the array substrate.
Figure 12:
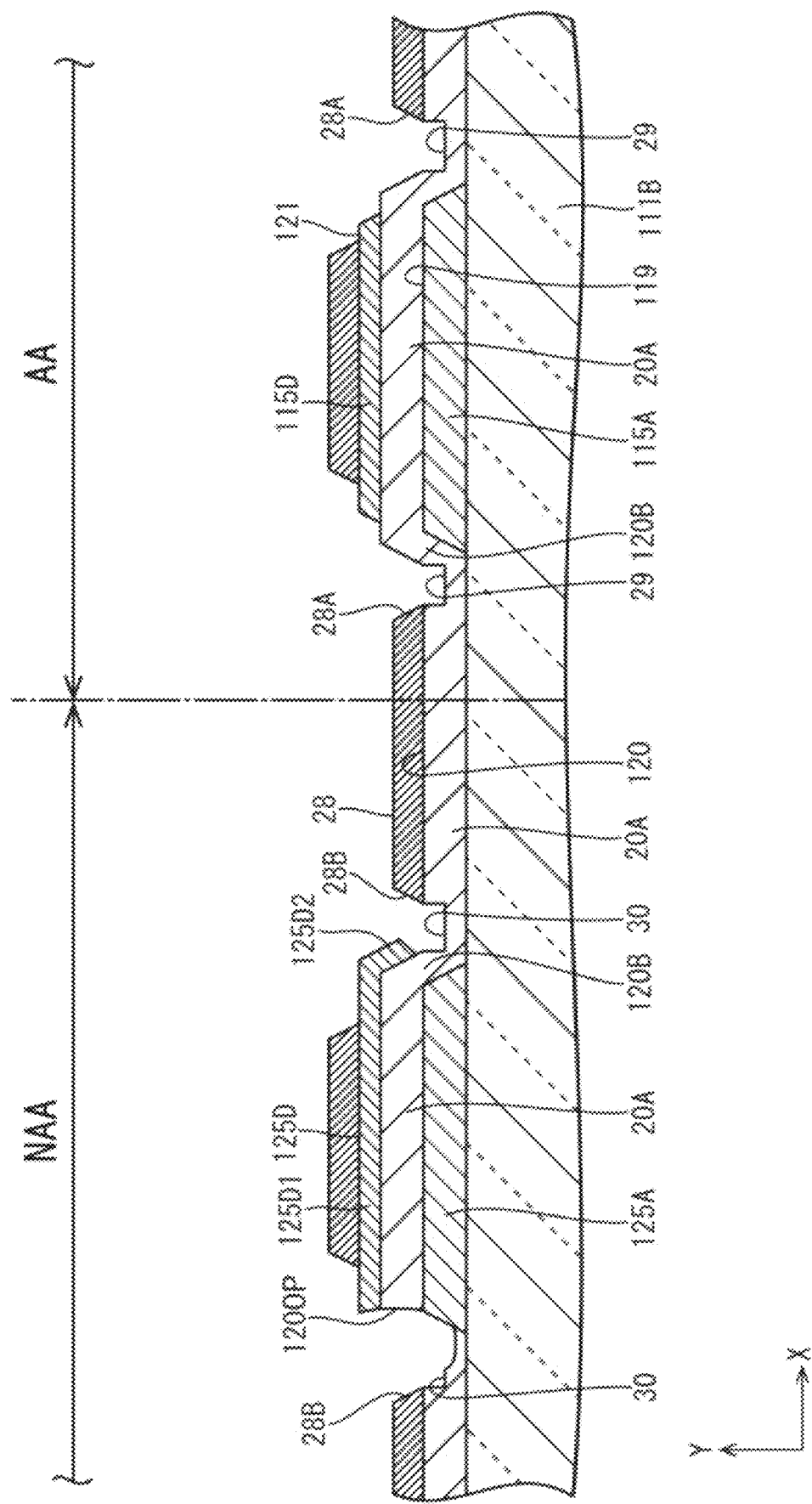
FIG. 12 is a cross-sectional view along line A-A in FIG. 8 illustrating that a hole is created in a gate insulator due to discharge in producing the array substrate.
Figure 13:
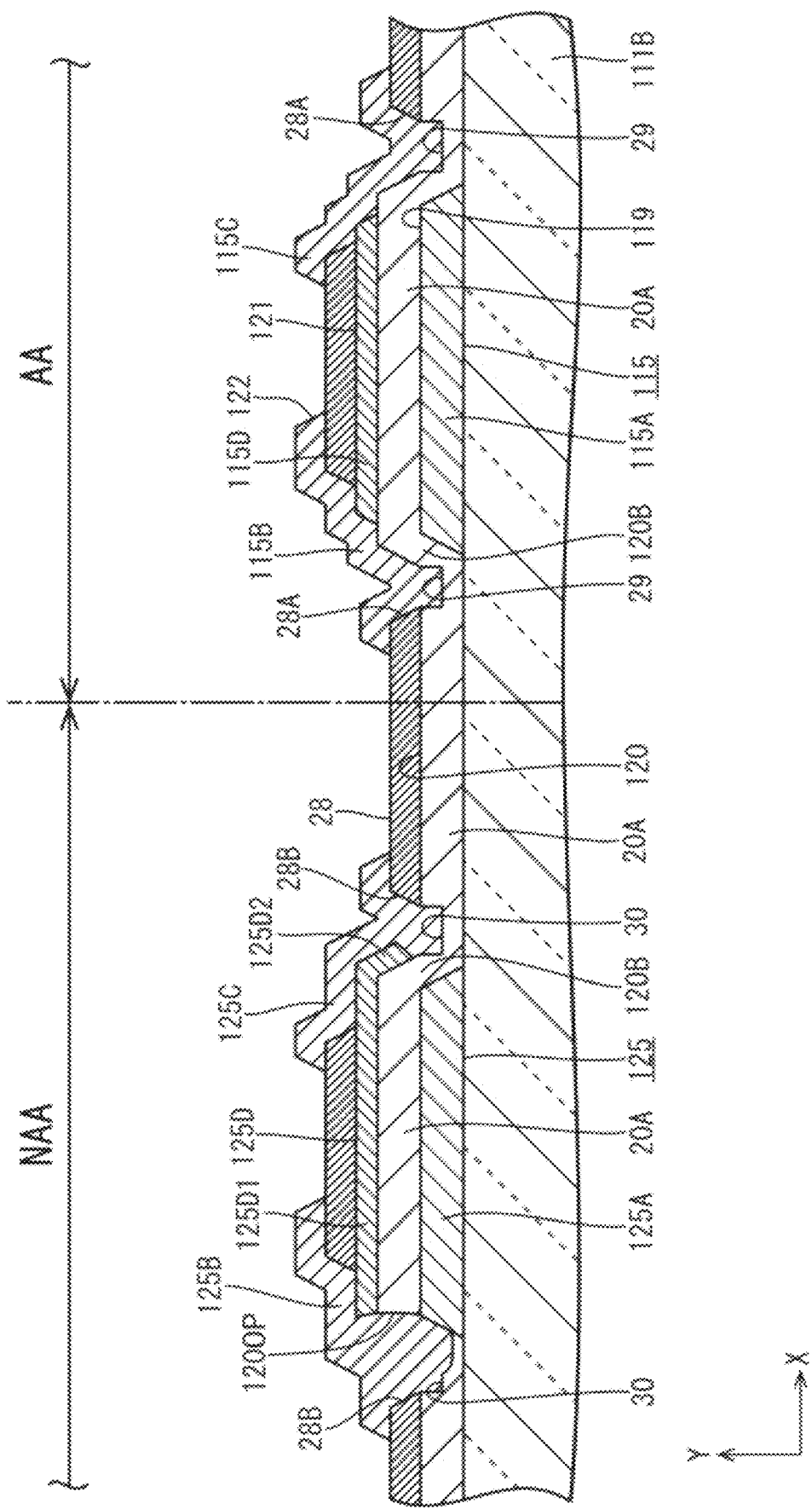
FIG. 13 is a cross-sectional view along line A-A in FIG. 8 illustrating a second metal film with patterning in producing the array substrate.

The present embodiment has the configuration described above. Next, a method of producing the array substrate 111B will be described. After the first metal film 119, the gate insulator 120, and the semiconductor film 121 are formed, the etching stopper film 28 is formed and subsequently, a photoresist film is formed in the sequence similar to that of the first embodiment. The etching stopper film 28 is etched through the photoresist film that is patterned with the exposure/developing processes similar to the first metal film 19 described in the first embodiment. The etching stopper film 28 is patterned with etching such that the pixel holes 28A and the dummy pixel holes 38B are formed as illustrated in FIG. 11. If the over-etching occurs in this process, the pixel recess 29 and the dummy pixel recess 30 are formed to be communicated with the pixel hole 28A and the dummy pixel hole 28B, respectively, in the gate insulator 120 that is disposed in a layer lower than the etching stopper film 28. The photoresist film formed on the etching stopper film 28 is removed with ashing or removal liquid after the etching of the etching stopper film 28.

Until the pixel holes 28A and the dummy pixel holes 28B are formed after the etching stopper film 28 is formed, the gate lines 117 that are sections of the first metal film 119 may be charged by electrostatic charge created when the glass substrate is transferred by the transfer device. Charges that are stored in the gate lines 117 according to the charge may be discharged over the gate insulator 120 toward the semiconductor film 121. As illustrated in FIG. 11, the pixel recesses 29 that are communicated with the respective pixel holes 28A are formed in the angled portions 120B of the gate insulator 120 that extend upward along the edge portions of the gate electrodes 115A. The dummy pixel recesses 30 that are communicated with the dummy pixel holes 28B are formed in the angled portions 120B that extend upward along the edge portions of the dummy gate electrodes 125A. The angled portion overlapping portion 125D2 of the dummy semiconductor section 125D overlaps the angled portion 120B of the gate insulator 120 that includes the dummy pixel recess 30. According to such a configuration, the charges stored in the gate line 117 may not be discharged over the angled portion 120B having the pixel recess 29 but are more likely to be discharged over the angled portion 120B having the dummy pixel recess 30 and toward the angled portion overlapping portion 125D2. Accordingly, electrostatic breakdown in the pixel 111PX caused by the charging of the gate lines 117 is likely to be prevented more surely. The portion where electrostatic discharge is caused is designated with "x". In the present embodiment, electric discharge occurs near the dummy pixel hole 28B that is for connecting a dummy source electrode 125B, which will be described later, and the dummy semiconductor section 125D; however, similar operations and effects are obtained in a configuration in which electric discharge occurs near the dummy pixel hole 28B that is for connecting the dummy drain electrode 125C and the dummy semiconductor section 125D.

If electricity is discharged from the dummy gate electrode 125A to the angled portion overlapping portion 125D2 of the dummy semiconductor section 125D, a hole 1200P may be created in the angled portion 120B of the gate insulator 120 by the electrostatic breakdown. Thereafter, the second metal film 122 is formed on the surface of the etching stopper film 28. The second metal film 122 is patterned similar to the earlier described first embodiment such that the source lines 118 (including the source electrodes 115B), the drain electrodes 115C, the dummy drain electrodes 125C, and the dummy line 127 (including the dummy source electrodes 125B) are formed. The source electrodes 115B and the drain electrodes 115C are connected to respective end portions of the semiconductor sections 115D through the pixel holes 28A in the etching stopper film 28. The dummy source electrodes 125B and the dummy drain electrodes 125C are connected to respective end portions of the dummy semiconductor sections 125D through the dummy pixel holes 28B in the etching stopper film 28. Thus, since the dummy pixel holes 28B in the etching stopper film 28 are closed by the dummy source electrodes 125B and the dummy drain electrodes 125C, the dummy semiconductor sections 125D are less likely to be exposed through the dummy pixel holes 28B. One of the dummy source electrodes 125B and the dummy drain electrodes 125C that overlap the hole 1200P formed in the angled portion 120B of the gate insulator 120 (the dummy source electrode 125B in this embodiment) may be short-circuited to the dummy gate electrode 125A; however, the dummy TFTs 125 are not involved in displaying. Therefore, displaying is not adversely affected by the short-circuit.

As described earlier, according to the present embodiment, the array substrate 111B includes the source lines 118 that are sections of the second metal film 122 disposed in a layer upper than the semiconductor film 121 via the etching stopper film 28 (the second insulator) in the display area AA. At least a portion of the source line 118 is connected to the end portion of the semiconductor section 115D and the source lines 118 cross the gate lines 117. The etching stopper film 28 includes the pixel holes 28A and the dummy pixel holes 28B. The pixel hole 28A is open such that a portion of each pixel hole 28A overlaps an end portion of the semiconductor section 115D and other portion of each pixel hole 28A does not overlap the semiconductor section 115D in the display area AA. The dummy pixel hole 28B is open such that a portion of each dummy pixel hole 28B overlaps an end portion of the dummy semiconductor section 125D and other portion of each dummy pixel hole 28B does not overlap the dummy semiconductor section 125D in the non-display area NAA. According to such a configuration, if the semiconductor sections 115D become in the conductive state according to the signal transferred to the gate lines 117, the signal supplied to the source lines 118 is supplied to the semiconductor sections 115D. Since the etching stopper film 28 is disposed between the semiconductor film 121 and the second metal film 122, the semiconductor sections 115D disposed in a layer lower than the etching stopper film 28 are less likely to be over-etched when forming at least the source lines 118 by patterning the second metal film 122. The etching stopper film 28 includes the pixel holes 28A for connecting the source lines 118, which are sections of the second metal film 122, to the semiconductor sections 115D. The pixel holes 28A are formed by patterning the etching stopper film 28 with the photolithography method. If the gate lines 117 and the semiconductor sections 115D are further refined by enhancement of resolution, a hole area of the pixel hole 28A may become necessarily larger than a forming range of the semiconductor section 115D because of the resolution limitation of a producing device. The pixel holes 28A are formed by etching the etching stopper film 28. In the etching, over-etching may occur and the gate insulator 120 in the lower layer may be recessed. Accordingly, electric discharge is likely to occur between the gate lines 117 and the semiconductor sections 115D. In this respect, the etching stopper film 28 includes the dummy pixel holes 28B. The dummy pixel hole 28B is formed such that a portion thereof overlaps an end portion of the dummy semiconductor section 125D and other portion thereof does not overlap the dummy semiconductor section 125D. Therefore, if a recess that is communicated with the pixel hole 28A is formed in the gate insulator 120, a recess that is communicated with the dummy pixel hole 28B is also formed. Accordingly, electric discharge is likely to occur between the gate lines 117 and the dummy semiconductor sections 125D compared to between the gate lines 117 and the semiconductor sections 115D. Accordingly, electrostatic breakdown in pixels 111PX is further less likely to be caused. The source lines 118 cross the gate lines 117 while having at least the gate insulator 120 therebetween to keep insulation.

the array substrate 111B includes the dummy line 127 that is a section of the second metal film 122 and crosses the gate lines 117. At least portions of the dummy line 127 are connected to end portions of the dummy semiconductor sections 125D through the dummy pixel holes 28B in the etching stopper film 28. According to such a configuration, since the dummy line 127 is connected to the end portions of the dummy semiconductor sections 125D through the dummy pixel holes 28B formed in the etching stopper film 28, the dummy semiconductor sections 125D are less likely to be exposed through the dummy pixel holes 28B unlike a configuration without including the dummy line 127.

Other Embodiments

The present technology is not limited to the embodiments described above and illustrated by the drawings. For example, the following embodiments will be included in the technical scope.

(1) Other than each of the above embodiments, the specific overlapping area of the angle portion overlapping portion of the dummy semiconductor section that overlaps the angled portion of the gate insulator may be altered as appropriate. For example, the angled portion overlapping portion of the dummy semiconductor section may not overlap an entire area of the angled portion. The angled portion overlapping portion of the dummy semiconductor section may partially overlap the angled portion at a ratio other than that illustrated in the drawings in each of the embodiments.

(2) In each of the above embodiments, the interval between the dummy TFT and the TFT that are adjacent to each other in the X-axis direction is equal to the interval between the TFTs that are adjacent to each other in the X-axis direction; however, the intervals thereof may be different.

(3) In each of the above embodiments, only a column of the dummy pixels that are arranged along the Y-axis direction is arranged; however, multiple rows of dummy pixels may be arranged at intervals with respect to the X-axis direction. In such a configuration, an interval between the dummy pixels that are adjacent to each other in the X-axis direction is preferably equal to an interval between the pixels that are adjacent to each other in the X-axis direction but may be different.

(4) In each of the above embodiments, the dummy line extends and crosses the dummy pixels that are arranged along the Y-axis direction but may be separated into sections for every dummy pixel.

(5) In each of the above embodiments, the dummy line is included but may be omitted. In such a configuration, only the dummy source electrodes may be included but the dummy source electrodes may be also omitted. If the dummy source electrodes are omitted, the dummy drain electrodes are also preferably omitted. However, it is not limited thereto.

(6) In each of the above embodiments, the dummy pixel electrodes are included but may be omitted. In such a configuration, the dummy pixel contact holes may be preferably omitted. However, it is not limited thereto.

(7) In each of the above embodiments, the gate line partially has wide sections; however, the gate line may have a constant width over an entire length thereof. In such a configuration, portions of a body of the gate line are configured as the gate electrodes and the dummy gate electrodes.

(8) Other than the second embodiment, the specific opening area of the pixel hole and the dummy pixel hole (position relation of the holes and the semiconductor section and the dummy semiconductor section) may be altered as appropriate. For example, the pixel hole and the dummy pixel hole may have an opening area that is larger than the semiconductor section and the dummy semiconductor section only in the X-axis direction. The pixel hole and the dummy pixel hole may have an opening area that is larger than the semiconductor section and the dummy semiconductor section only in the Y-axis direction. The pixel hole and the dummy pixel hole may have an opening area that is larger than the semiconductor section and the dummy semiconductor section only at one side with respect to the Y-axis direction.

(9) In the second embodiment, the pixel hole and the dummy pixel hole have the similar opening area (position relation of the holes and the semiconductor section and the dummy semiconductor section). However, the pixel hole and the dummy pixel hole may have different opening areas.

(10) In each of the above embodiments, the inter-electrode insulator is made of organic insulating material but may be made of inorganic insulating material. The inter-electrode insulator may have a multi-layer structure including a first inter-electrode insulator made of inorganic material and a second inter-electrode insulator made of organic material.

(11) Other than each of the above embodiments, the liquid crystal panel may be configured to operate in TN mode, FF mode, or IPS mode.

(12) In each of the above embodiments, the transmission type liquid crystal panel is provided as an example. However, a reflection type liquid crystal panel or a semi-transmission type liquid crystal panel may be another example.

(13) In each of the above embodiments, the liquid crystal panel is provided as an example. However, other types of display panels (e.g., organic EL display panels and microcapsule electrophoretic display (EPD) panels, micro electro mechanical system (MEMS) panels) may be provided as other examples.

The invention claimed is:

1. A substrate for a display device comprising:
    a line extending across a display section and a non-display section of the substrate corresponding to a display area and a non-display area of the display device, the line being formed from a metal film;
    an insulator being disposed over the line;
    a pixel being disposed in the display section, the pixel comprising:
        a first overlapping portion being coupled to the line and made of the metal film; and
        a first semiconductor portion being formed from a semiconductor film; and
    a dummy pixel being disposed in the non-display section, the dummy pixel comprising:
        a second overlapping portion being couple to the line and made of the metal film;
        a second semiconductor portion being formed from the semiconductor film, wherein the insulator includes:
        a first flat portion that covers a section of the line adjacent to the first overlapping portion of the pixel other than edges of the first overlapping portion of the pixel;
        a second flat portion that covers a section of the first overlapping portion of the pixel other than edges of the first overlapping portion of the pixel;
        a third flat portion that covers a section of the line adjacent to the second overlapping portion of the dummy pixel other than edges of the second overlapping portion of the dummy pixel;
        a fourth flat portion that covers a section of the second overlapping portion of the dummy pixel other than edges of the second overlapping portion of the dummy pixel;
        first angled portions that cover the edges of the first overlapping portion of the pixel; and
        second angled portions that cover the edges of the second overlapping portion of the dummy pixel,
    the first semiconductor portion of the pixel is disposed over the first flat portion and the second flat portion of the insulator but not over the first angled portions of the insulator, and
    the second semiconductor portion of the dummy pixel is disposed over the third flat portion, the fourth flat portion, and at least sections of the second angled portions of the insulator.

2. The substrate for a display device according to claim 1, wherein
    the line is defined as a first line,
    the metal film is defined as a first metal film, and
    the substrate further comprises:
        a second line being disposed in the display section and being formed from a second metal film, the second lines including a portion that is coupled to at least an upper surface of one end of the first semiconductor section, the second line crossing the first line; and
        a dummy line being disposed in the non-display section and being formed from the second metal film, the dummy line including a portion that is coupled to at least an upper surface of one end of the second semiconductor section and crossing the first line.

3. The substrate for a display device according to claim 2, further comprising an inter-electrode insulator, wherein
    the pixel includes an electrode being formed from the second metal film,
    the electrode including a portion that is coupled to at least an upper surface of another end of the first semiconductor section;
    the pixel includes a pixel electrode formed from a transparent electrode film,
    the inter-electrode insulator is disposed between the electrode and the pixel electrode,
    the inter-electrode insulator includes a pixel contact hole and a dummy pixel contact hole,
    the pixel electrode is coupled to the electrode through the pixel contact hole;
    the dummy pixel includes a dummy electrode formed from the second metal film,
    the dummy electrode includes a portion that is coupled to at least an upper surface of another end of the second semiconductor sections,
    the dummy pixel includes a dummy pixel electrode formed from the transparent electrode film, and
    the dummy pixel electrode is coupled to the dummy electrode through the dummy pixel contact hole.

4. The substrate for a display device according to claim 2, further comprising a driver coupled to the second line but not coupled to the dummy lines, wherein the driver supplies signals to the second line.

5. The substrate for a display device according to claim 1, wherein
    the insulator is defined as a first insulator, and
    the substrate further comprises:
        a second insulator including a pixel hole in the display section and a dummy pixel hole in the non-display section; and
        a second line being disposed in the display section and being formed from a second metal film, the second line including a portion that is coupled to at least an upper surface of one end of the first semiconductor section, the second line crossing the first line,
    the pixel hole includes a first section opposite the end of the first semiconductor portion and a second section not opposite the end of the first semiconductor portion, and
    the dummy pixel hole includes a first section opposite an end of the second semiconductor portion and a second section not opposite the end of the second semiconductor portion.

6. The substrate for a display device according to claim 5, further comprising a dummy line being disposed in the non-display section and formed from the second metal film, the dummy line including a portion that is coupled to at least the one end of the second semiconductor portion through the dummy pixel hole.

7. A display device comprising:
the substrate according to claim 1; and
a counter substrate opposed to the substrate.

* * * * *